United States Patent [19]

Yoshioka

[11] 4,176,405
[45] Nov. 27, 1979

[54] MAGNETIC BUBBLE DEVICE

[75] Inventor: Nobuya Yoshioka, Tokyo, Japan

[73] Assignee: Nippon Electric Co., Ltd., Tokyo, Japan

[21] Appl. No.: 895,823

[22] Filed: Apr. 13, 1978

[30] Foreign Application Priority Data

Apr. 22, 1977 [JP] Japan .................................. 52-47078

[51] Int. Cl.² ............................................. G11C 19/08
[52] U.S. Cl. ........................................ 365/15; 365/26; 365/33
[58] Field of Search ...................... 365/14, 15, 16, 17, 365/26

[56] References Cited

U.S. PATENT DOCUMENTS

| | | | |
|---|---|---|---|
| 3,792,450 | 2/1974 | Bogar | 365/15 |
| 4,007,447 | 2/1977 | Bobeck | 365/26 |
| 4,117,544 | 9/1978 | Ault | 365/8 |
| 4,133,043 | 1/1979 | Hiroshima et al. | 365/15 |

Primary Examiner—James W. Moffitt
Attorney, Agent, or Firm—Sughrue, Rothwell, Mion, Zinn and Macpeak

[57] ABSTRACT

A magnetic bubble storage device is formed with a major-minor loop organization wherein the bit pitch in at least a part of a first region of the major loop other than a second region where the major loop and the minor loops are connected is larger than the bit pitch in the second region. This permits the realization of a pattern arrangement with a broader operating margin and also facilitates the addition of redundant minor loops.

2 Claims, 5 Drawing Figures

MAGNETIC BUBBLE DEVICE

BACKGROUND OF THE INVENTION

The present invention relates to a magnetic domain (magnetic bubble) device for use as a memory and the like.

It is well known that when a uniform bias magnetic field of an appropriate intensity is applied perpendicularly to the surface of a magnetic medium such as garnet having a uniaxial magnetic anistropy and the easy magnetization axis perpenducular to the surface, a magnetic bubble surrounded by a single magnetic wall whose magnetization is reversed to that in the adjacent bubble, is formed. By giving a magnetic field gradient to this bubble, the bubble moves along the gradient magnetic field. This nature enables the realization of a magnetic storage device, and also the designing of a logic circuit element becomes possible by utilizing the fact that a magnetic repulsive force is exerted upon one another between two or more magnetic bubbles.

To design a magnetic storage device using magnetic bubbles, a major-minor loop organization, a decoder organization, etc. have been adopted at present. Briefly describing the major-minor loop organization which is most frequently used now among those organizations, this organization is formed of two kinds of closed loops, that is, memory loops for storing information which are called minor loops and a propagation loop for writing in and reading out information which is called a major loop. The major loop is provided with a generator, a detector and an annhilator for the magnetic bubbles. The transfer of information between said major loop and said minor loops is controlled through a gate. Such a major-minor loop organization is disclosed, for instance, in FIG. 1 of U.S. Pat. No. 3,618,054.

To construct a magnetic bubble storage device using such a major-minor loop organization, the following three conditions must be satisfied. Assuming that the number of bits in the major loop is $N_{Mb}$ while the number of bits in one minor loop is $N_{mb}$, the following condition must be satisfied in order to make a magnetic bubble come again to the same address position in the minor loop upon rewriting:

$$N_{Mb} = nN_{mb} - N_{gb} \text{ (n: an integer)}, \quad (1)$$

where $N_{gb}$ represents the number of bits needed for transferring through a gate, and in the case of the conventional Y—Y gates or dollar sign gates, generally $N_{gb}=1$. In addition, to shorten the access time and the cycle time, $n=1$ is desirable. As a result, the first condition takes the following form:

$$N_{Mb} = N_{mb} - 1 \quad (2)$$

Secondly, if the number of the minor loops is represented by $N_m$, the value of $N_m$ should take an integral power of 2 in view of the data construction, that is, it is necessary to meet the following condition:

$$N_m = 2^k \text{ (k: an integer)} \quad (3)$$

Moreover, in general, the storage device should preferably take a square shape or an approximately square shape, and as a result, if it is attempted to form the major-minor loop also in such a shape, the following third condition must be met:

$$N_{mb} = 4N_m \quad (4)$$

To satisfy the above-mentioned three equations (2), (3) and (4) is a basic prerequisite for the adoption of the major-minor loop organization. Especially, on the basis of equations (3) and (4), equation $N_{mb}=2^{k+2}$ can be derived so that the number of bits in the minor loop also becomes an integral power of 2, and consequently, in view of the functions of a binary address counter or the like in peripheral circuits a remarkably improved major-minor loop organization can be attained.

However, as a practical matter, the following problems occur in a magnetic bubble storage device satisfying the above-mentioned three conditions. For instance, considering now a 64-kilobit (64-K bit) storage device as one example, $N_m=128$, $N_{mb}=152$ and $N_{Mb}=511$ are determined according to equations (2), (3) and (4), and so, the pattern arrangement is as shown in FIG. 1. In this figure, reference numeral 1 designates a major loop, numeral 2 designates minor loops, and numeral 3 designates gates. A small circle in the major loop 1 represents a 1-bit pattern. However, the respective half-bit patterns at corner portions 11 and 12 in the major loop 1 are omitted from the illustration. It is noted here that the number of the gates 3 must be selected equal to the number of the minor loops 2, and that in the case of connecting the minor loops 2 to the major loop 1, the connection can be made only for alternate ones of the bit pattern in the major loop 1 in view of the shape of the minor loops 2. More particularly, when 128 minor loops 2 are connected to a major loop 1 via 128 gates 3, 255 bits of the 511 bits in a major loop 1 is used for that purpose. Furthermore, from the restriction on the arrangement of the generator, detector and the like for magnetic bubbles, it is desirable for the gates 3 to be aligned on one side of the major loop 1 so that on the opposite side of the major loop 1 with respect to the gates 3 is also formed a bit pattern equivalent to 255 bits. Accordingly, two corner portions 11 and 12 of the major loop 1 must be composed of the remaining one bit, and this results in a pattern arrangement having a considerably small margin. Actually, when an operating margin for a bias magnetic field in a magnetic bubble storage device having the above-mentioned construction was measured, it proved that since the sections of the major loop connected to the gates at the opposite ends and the corner portions of the major loop were too close to each other, a margin width of the bias magnetic field was small as represented by a curve B in FIG. 4, resulting in an unstable operation. Also, the addition of redundant minor loops as a measure for deficient minor loops which occur unavoidably in the case of forming the major-minor loop organization, is quite impossible in the conventional construction.

So far, in order to solve these problems, the following method has been mainly adopted. In this method, the number of bits in the minor loop is increased so that a larger number of bits may be used in the major loop, whereby the pattern arrangement is allowed to have a larger margin. However, this method can not satisfy the condition as defined by equation (4) above, and accordingly, there is a disadvantage that the number of bits in the minor loop does not become an integral power of 2, complicating the peripheral circuits.

SUMMARY OF THE INVENTION

It is one object of the present invention to provide a magnetic bubble storage device of major-minor loop organization free from the above-described disadvantages which fulfills all the above-described conditions (2), (3) and (4) and which realizes a pattern arrangement with a broader operating margin and also permits the addition of redundant minor loops.

The present device including a magnetic medium for holding magnetic bubbles, means for giving a bias magnetic field perpendicular to the surface of the magnetic medium, a major loop provided on said magnetic medium, a plurality of minor loops provided on said magnetic medium for storing the magnetic bubbles, and a plurality of gates provided between said major loop and said minor loops for performing transfer of the magnetic bubbles therebetween, wherein the bit pitch in at least a part of a first region on said major loop other than a second region where said major loop and said gates are connected, is selected larger than the bit pitch in said second region.

BRIEF DESCRIPTION OF THE DRAWINGS

Now the present invention will be described in greater detail in conjunction with the accompanying drawings, in which.

DESCRIPTION OF THE PREFERRED EMBODIMENTS

Figure 1:
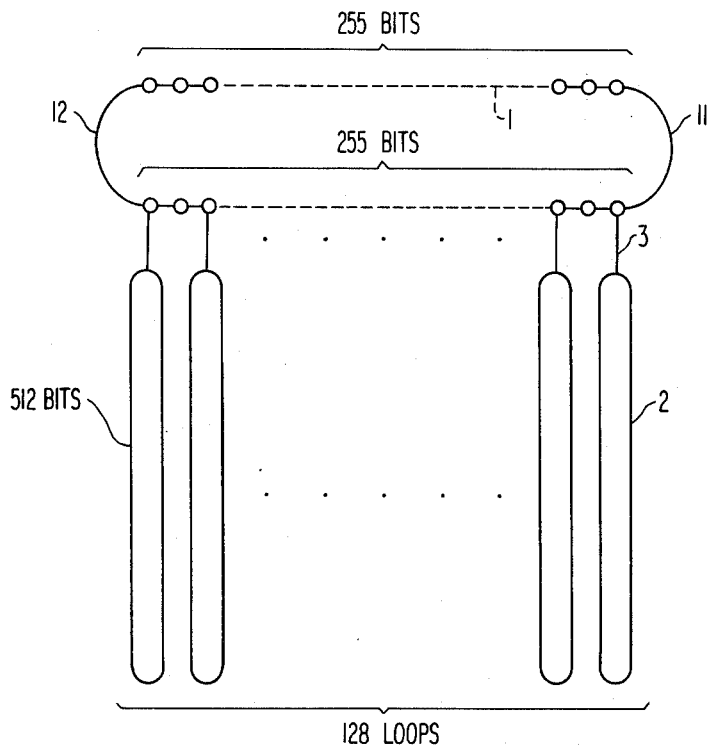
FIG. 1 shows a schematic diagram of a magnetic bubble storage device in the prior art.
Figure 2:
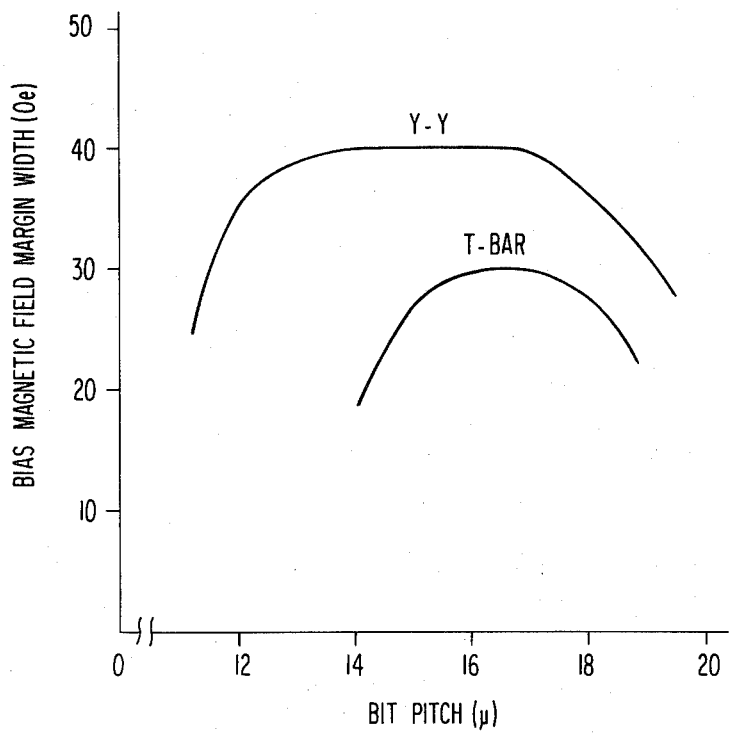
FIG. 2 is a diagram showing the relationship between a bias field margin width and a bit pitch.

Now the present invention will be described on the basis of experimental results. As a method for driving a magnetic bubble, the so-called field access method, in which an inplane rotating magnetic field is employed, is known. In this case, as a medium for driving the magnetic bubble, a T-bar pattern, half-disk pattern or Y—Y pattern made of a thin film of soft magnetic material such as permalloy have been often used. The optimum bit pitch of these patterns depends upon a diameter of magnetic bubbles, and for instance, in the case of magnetic bubbles having a diameter of 3.5 microns, the bit pitch of maximizing their propagation margin is about 14 microns for the Y—Y pattern and about 16 microns for the T-bar pattern. However, these values always have a tolerance and there is no need to adjust the bit pitch just at that value. The more detailed experimental results are shown in FIG. 2. A crystal of a magnetic medium used in this experiment has a composition of $(YSm Tm Ca)_3(FeGe)_5O_{12}$ and the diameter of magnetic bubbles in this magnetic medium is 3.5 microns. In FIG. 2, a bit pitch is taken along the abscissa and a bias magnetic field margin width for enabling propagation of magnetic bubbles is taken along the ordinate. As will be seen from FIG. 2, both the Y—Y pattern and the T-bar pattern have a tolerance for the bit pitch, and explaining about the Y—Y pattern, the margin width is almost constant in the range of 14 to 17 microns and a broad operating margin of about 40 Oe is allowed. Accordingly, even for the same diameter of magnetic bubbles, various bit pitches in the range of 14 to 17 microns can be adopted. The essential feature of the present invention lies in the positive utilization of these experimental results.

Figure 3:
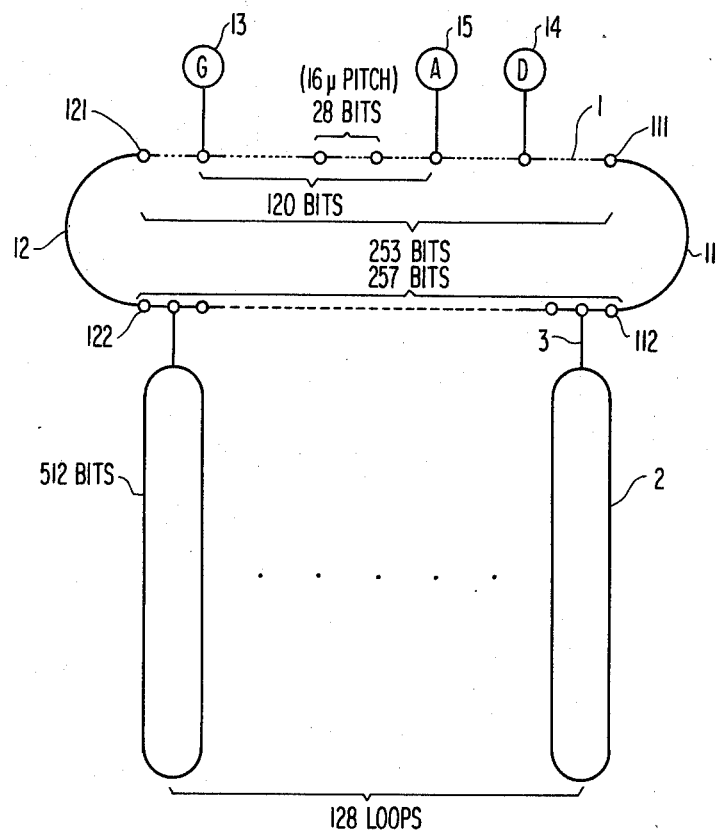
FIG. 3 is a schematic diagram of one embodiment of the present invention.
Figure 4:
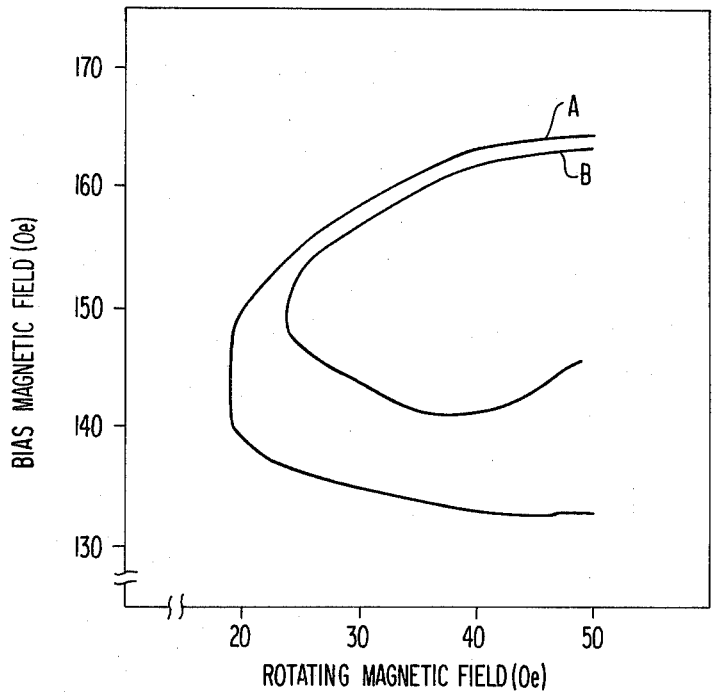
FIG. 4 is a diagram of an operation margin of a bias magnetic field in the embodiment shown in FIG. 3 and in the storage device in the prior art.

Now the present invention will be described in detail referring to one embodiment. A magnetic bubble storage device having a memory capacity of 64-K bits according to the present invention is illustrated in FIG. 3. In this figure, propagation paths of magnetic bubbles consisting of the Y—Y pattern which is formed on a magnetic medium holding the magnetic bubbles are shown, but the magnetic medium itself, magnetic means for holding the bubbles, magnetic means for propagating the bubbles and external circuits needed for operating the device as a storage device, are omitted for simplification of drawing. The present device is comprised of a major loop 1 consisting of 511 bits and including corner sections 11 and 12 at two locations, and a generator 13, a detector 14 and an annihilator 15 for magnetic bubbles, 128 minor loops 2 each consisting of 512 bits and 128 gates 3 for connecting these two kinds of loops. The annihilator 15 and the generator 13 are separated by 120 bits, and the section between these two elements consists of only a propagation path of the Y—Y pattern (not shown) but does not include functional elements such as a generator for magnetic bubbles. With regard to a bit pitch, only 28 bits included in the section between the annihilator 15 and the generator 13 have a bit pitch of 16 microns, and in the other section of the major loop and in the minor loops all the bit pitches are selected equal to 14 microns. Thus, it will be seen that the 28-bit section having a pitch of 16 microns, that is, the section of 448 microns corresponds to a 32-bit section in the case of a pitch of 14 microns so that as compared with an equal-pitch pattern, the number of bits in the major loop is reduced by 4 bits equal to the difference between 32 bits and 28 bits. Therefore, by disposing these four bits so as to be uniformly distributed in the neighborhoods 111, 112, 121 and 122 of the major loop corner portions 11 and 12, that is, by distributing 257 bits on the gate side of the major loop and 253 bits on the opposite side, the intervals between the gates at the opposite ends and the corner portions 11 and 12, respectively, can be taken by one bit, and so, the operating margin can be widely improved as shown by a curve A in FIG. 4. More particularly, at a rotating magnetic field of 40 Oe, the bias magnetic field margin width according to the present invention is about 30 Oe, which is considerably improved as compared with a device not adopting the major loop construction of the present invention, and which is well adapted for practical uses.

As will be seen from the above-described embodiment, by increasing a bit pitch in a part of a major loop by 2 microns with respect to that in the remaining loop part, it has become possible to realize a magnetic bubble storage device capable of satisfying all the necessary conditions (2), (3) and (4) above for constructing a major-minor loop organization and yet having a sufficient operating margin. In addition, according to the improved construction, the bit density is not lowered because of the minor loop design, in the same manner as the conventional one.

Figure 5:
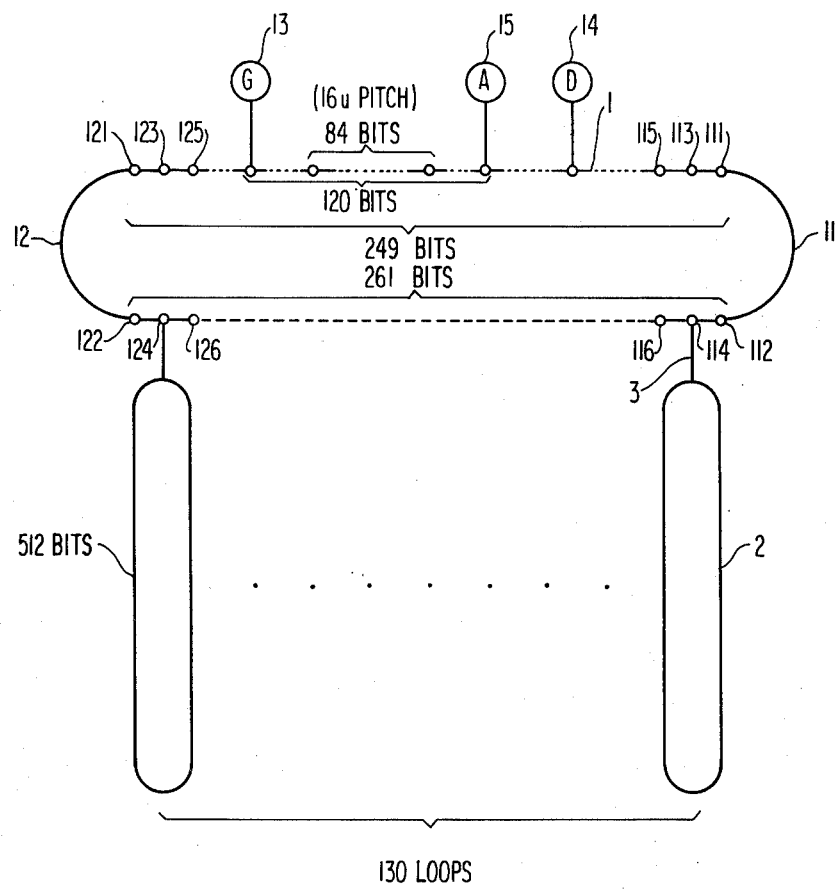
FIG. 5 is a schematic diagram of another embodiment of the present invention.

A second embodiment of the present invention having a memory capacity of 64-K bits and using a redundant construction provided with two spare minor loops is illustrated in FIG. 5. The meaning of the symbols and numerals used in FIG. 5 and the construction of the sections not specifically marked are the same as those in FIG. 3, and therefore, explanation thereof will be omitted. The present device is composed of a major loop consisting of 511 bits, 130 minor loops 2 each consisting of 512 bits and 130 gates 3. With regard to the bit pitch, for 84 bits between an annihilator 15 and a generator 13, the bit pitch is selected equal to be 16 microns, but the bit pitches at the remaining section are all selected equal to be 14 microns. Thus, it will be seen that the 84 bit section having the bit pitch of 16 microns, that is, the section of 1344 microns corresponds to a 96-bit section in the case of a pitch of 14 microns so that the number of bits in the major loop is reduced by 12 bits equal to the difference between 96 bits and 84 bits. Therefore, by disposing these 12 bits so as to be uniformly distributed in the neighborhoods 111 to 116 and 121 to 126 of the major loop corner portions 11 and 12, that is, by distributing 261 bits on the gate side of the major loop and 249 bits on the opposite side, 130 minor loops can be disposed with the intervals of one bit retained between the gates at the opposite ends and the corner portions 11 and 12, respectively. Among these 130 minor loops, those used actually are defect-free 128 loops, and so, the above-mentioned conditions (2), (3) and (4) are all fulfilled, and the remaining two loops are kept unused because of manufacturing defects. The bias magnetic field operating margin of the present device is wider as shown in the curve A of FIG. 4.

Although the present invention has been described before in connection to its two embodiments, the distance between the major loop section connected to the gates and the nearest major loop corner section need not be limited to a distance equivalent to one bit, but it can be selected at a longer distance, and in either case the advantages are exactly the same. Also, the propagation path for the magnetic bubbles need not be limited to the Y—Y pattern, but the present invention can be applied to the T-bar, half-disk chevron and any other patterns so long as the pattern has a sufficient operating margin for a given bit pitch.

According to the present invention, an optimum major-minor loop construction satisfying the equations (2), (3) and (4) above can be realized without deteriorating the operating margin, and also, the addition of spare minor loops for providing a redundant construction is facilitated. Furthermore, since the major-minor loop construction is optimized, the construction of the peripheral circuits can not only be simplified but also the present device can be standardized, resulting in the reduction in the manufacturing cost as well as the realization of the higher quality of the device.

What is claimed is:

1. In a magnetic bubble storage device including a magnetic medium for holding magnetic bubbles; means for giving a bias magnetic field perpendicular to the surface of said magnetic medium; a major loop provided on said magnetic medium; a plurality of minor loops provided on said magnetic medium for storing the magnetic bubbles; and a plurality of gates provided between said major loop and said minor loops for performing transfer of the magnetic bubbles therebetween, the improvement wherein the bit pitch in at least a part of a first region on said major loop other than a second region where said major loop and said gates are connected is larger than the bit pitch in said second region.

2. A magnetic bubble storage device as claimed in claim 1, wherein gate connecting sections at the opposite ends of said second region on said major loop where said major loop and said gates are connected, are separated from the nearest corner sections on the major loop by a distance equivalent to at least one bit.

* * * * *

UNITED STATES PATENT AND TRADEMARK OFFICE
CERTIFICATE OF CORRECTION

PATENT NO. : 4,176,405
DATED : November 27, 1979
INVENTOR(S) : Nobuya Yoshioka

It is certified that error appears in the above-identified patent and that said Letters Patent are hereby corrected as shown below:

Column 2, line 18, delete "152" insert --512--

Signed and Sealed this

Eighteenth Day of March 1980

[SEAL]

Attest:

SIDNEY A. DIAMOND

Attesting Officer     Commissioner of Patents and Trademarks